(12) United States Patent
Liao

(10) Patent No.: US 12,550,250 B2
(45) Date of Patent: Feb. 10, 2026

(54) PACKAGE STRUCTURE AND ELECTRONIC DEVICE

(71) Applicant: Huawei Digital Power Technologies Co., Ltd., Shenzhen (CN)

(72) Inventor: Xiaojing Liao, Shenzhen (CN)

(73) Assignee: HUAWEI DIGITAL POWER TECHNOLOGIES CO., LTD., Shenzhen (CN)

(*) Notice: Subject to any disclaimer, the term of this patent is extended or adjusted under 35 U.S.C. 154(b) by 321 days.

(21) Appl. No.: 18/477,863

(22) Filed: Sep. 29, 2023

(65) Prior Publication Data
US 2024/0121887 A1 Apr. 11, 2024

(30) Foreign Application Priority Data
Oct. 8, 2022 (CN) .......................... 202211223281.8

(51) Int. Cl.
*H05K 1/02* (2006.01)

(52) U.S. Cl.
CPC ........... *H05K 1/024* (2013.01); *H05K 1/0298* (2013.01); *H05K 2201/012* (2013.01); *H05K 2201/10181* (2013.01); *H05K 2201/10356* (2013.01)

(58) Field of Classification Search
CPC ............... H05K 1/0293; H05K 1/115; H05K 2201/10181; H01L 23/49827; H01L 23/62
See application file for complete search history.

(56) References Cited

U.S. PATENT DOCUMENTS

| | | |
|---|---|---|
| 10,950,587 B2 | 3/2021 | Jeon et al. |
| 2004/0040740 A1 | 3/2004 | Nakatani et al. |
| 2010/0142110 A1* | 6/2010 | Casper ................ H01H 85/046 361/104 |
| 2016/0374203 A1 | 12/2016 | Bakre et al. |
| 2019/0006282 A1* | 1/2019 | Eid ................... H01L 23/49838 |
| 2020/0022257 A1 | 1/2020 | Doyle et al. |
| 2023/0028233 A1* | 1/2023 | Shen ...................... H01H 85/06 |

FOREIGN PATENT DOCUMENTS

CN 114361040 A 4/2022

OTHER PUBLICATIONS

"Properties of Fuse Element Materials-Circuit Globe", Oct. 29, 2017, total 3 pages.
"Electrical Fuse Structure and Characteristics", Sep. 25, 2021, total 3 pages.

* cited by examiner

*Primary Examiner* — Nathan Milakovich
(74) *Attorney, Agent, or Firm* — Conley Rose, P.C.

(57) ABSTRACT

A package structure includes a protection structure, a circuit board, and a chip. The circuit board includes a first cabling layer, a dielectric layer, and a second cabling layer that are laminated. The protection structure is disposed inside the dielectric layer. The protection structure is configured to electrically connect the first cabling layer to the second cabling layer, and the chip is electrically connected to the first cabling layer or the second cabling layer. When the chip is short-circuited, the protection structure blows first.

20 Claims, 2 Drawing Sheets

PACKAGE STRUCTURE AND ELECTRONIC DEVICE

CROSS-REFERENCE TO RELATED APPLICATION

This claims priority to Chinese Patent Application No. 202211223281.8, filed on Oct. 8, 2022, which is hereby incorporated by reference in its entirety.

TECHNICAL FIELD

This application relates to the field of chip packaging technologies, and specifically, to a package structure and an electronic device.

BACKGROUND

After a package unit or a package module of a surface-mount chip is assembled onto a printed circuit board (PCB), the chip needs to be powered on. In a power-on process, if a component inside the chip is short-circuited, a large current is generated. When the large current flows through cables of the PCB, a high temperature is generated, which causes materials of the PCB to be carbonized and even catch fire.

In this case, the PCB loses basic functions, and all components on the PCB are scrapped, which causes a great loss.

SUMMARY

This application provides a package structure and an electronic device. The package structure has a protection structure. When a chip is short-circuited, the protection structure can self-blow to reduce a loss.

According to a first aspect, this application provides a package structure, including a protection structure, a circuit board, and a chip packaged on the circuit board. The circuit board includes a first cabling layer, a second cabling layer, and a dielectric layer. The first cabling layer, the dielectric layer, and the second cabling layer are laminated. The protection structure is disposed inside the dielectric layer. The protection structure is configured to electrically connect the first cabling layer to the second cabling layer. When the chip is packaged on the circuit board, the chip is electrically connected to the first cabling layer or the second cabling layer. In a process of powering on the chip, a current needs to flow through the protection structure to the chip electrically connected to the first cabling layer or the second cabling layer. When the chip is short-circuited, currents at the protection structure, the first cabling layer or the second cabling layer, and the chip are increased. A temperature of a cable used to carry the current and a temperature of the protection structure rise due to the increase in the currents. The protection structure is made of a hot-melt material, and a melting point of the hot-melt material used by the protection structure is lower than melting points of the first cabling layer or the second cabling layer through which the current flows when the chip is powered on. Therefore, the protection structure blows first. This can prevent the temperature of the cable from being excessively high, and therefore prevent the circuit board from being carbonized or catching fire, thereby reducing a loss.

A material of the protection structure may be a pure metal or an alloy, and the melting point of the protection structure is 260 degrees Celsius (° C.) to 450° C. (including 260° C. and 450° C.). More specifically, the material of the protection structure may be but is not limited to one of zinc, cadmium, tin-antimony, tin-lead, lead-antimony, aluminum-magnesium, or aluminum-antimony.

It should be noted that a room-temperature resistivity of the protection structure is <120 nanoohm meters (nΩ*m). This ensures that when the current flowing through the protection structure is normal, a temperature generated by the protection structure is low, to avoid affecting normal operation of the chip. The room-temperature resistivity of the protection structure may be but is not limited to 110 nΩ*m, 90 nΩ*m, or 85 nΩ*m. This is not specifically limited herein.

In a possible implementation, a via may be disposed on the dielectric layer, and the via may extend along a thickness direction of the dielectric layer. The protection structure may be disposed in the via, and two ends of the protection structure may be connected to the first cabling layer and the second cabling layer respectively, to ensure that the current flowing through the chip can flow through the protection structure and reach the chip connected to the first cabling layer or the second cabling layer.

In the foregoing implementation, to ensure that the first cabling layer and the second cabling layer can be stably connected to the protection structure, a first connection terminal may be disposed on the first cabling layer, and a second connection terminal may be disposed on the second cabling layer. The first connection terminal and the second connection terminal are disposed at two ends of the via. The first connection terminal may be electrically connected to one end of the protection structure, and the second connection terminal may be electrically connected to the other end of the protection structure.

Materials of the first connection terminal and the second connection terminal may be but are not limited to copper, aluminum, or stainless steel.

In the foregoing implementation, specifically, the protection structure may specifically have a plurality of shapes, for example, a cylinder, a rectangular column, or a triangular column.

In a possible implementation, the chip may be packaged inside the circuit board, and the chip may be electrically connected to the first cabling layer. That is, the chip is disposed on a side that is of the first cabling layer and that faces the second cabling layer. When the chip is powered on, the current flows through the second cabling layer, the protection structure, and the first cabling layer into the chip. When the chip is short-circuited, a current at the protection structure is increased. When the temperature of the protection structure rises to the melting point of the protection structure, the protection structure blows. This prevents temperatures of the first cabling layer and the second cabling layer through which the current flows from being excessively high, and therefore prevents the circuit board from being carbonized or catching fire, to avoid damage to another component connected to the circuit board, thereby reducing a loss.

It should be noted that the chip is packaged inside the circuit board, and the chip may be electrically connected to the second cabling layer.

In a possible implementation, the chip may alternatively be packaged on an outside of the circuit board, and a pin on the chip is connected to the first cabling layer or the second cabling layer. When the chip is connected to the first cabling layer, the pin faces the first cabling layer. When the chip is connected to the second cabling layer, the pin faces the second cabling layer.

When the chip is packaged on the outside of the circuit board and is connected to the first cabling layer, the pin on the chip may face a side away from the first cabling layer. The pin is electrically connected to the first cabling layer through a lead. When the chip is connected to the second cabling layer, the pin on the chip may face a side away from the second cabling layer. The pin is connected to the second cabling layer through a lead.

In the foregoing implementation, the first cabling layer may have a plurality of first cables, the second cabling layer may have a plurality of second cables, and the plurality of first cables and the plurality of second cables may be disposed in a one-to-one correspondence. Specifically, when the chip is packaged on the circuit board, there may be one chip or a plurality of chips. Correspondingly, one or more vias may be disposed on the dielectric layer, at least one via may be disposed between each pair of the first cable and the second cable, and each pair of the first cable and the second cable may correspond to one chip.

According to a second aspect, this application further provides an electronic device, where the electronic device includes a housing and the package structure in any technical solution of the first aspect, and the package structure may be disposed in the housing. An effect generated by the electronic device having the package structure is the same as an effect of the package structure. Details are not described herein again.

REFERENCE NUMERALS

10: circuit board; 11: first cabling layer; 110: first connection terminal; 111: third connection terminal; 12: dielectric layer; 13: second cabling layer; 130: second connection terminal; 20: protection structure; 30: chip; 31: pin.

DESCRIPTION OF EMBODIMENTS

To make the objectives, technical solutions, and advantages of this application clearer, the following further describes this application in detail with reference to the accompanying drawings.

A power chip is a common integrated chip, which can be used to step up or step down a voltage. With continuous development of electronic information technologies and increasing expansion of an analog integrated circuit market, the power chip is more widely applied. Main application fields include the fields of computers, network communication, consumer electronics, industrial control, and the like.

The power chip has a package structure, and each package structure may include a PCB and a chip packaged on the PCB. In a process of powering on the chip packaged on the PCB, if a short circuit occurs inside the chip, a large current is generated. When the large current flows through cables of the PCB, a high temperature is generated, which causes materials of the PCB to be carbonized or even catch fire, and causes components on the PCB to be scrapped. At present, a common solution is to add a fuse tube or a fuse chip to the outside of the PCB, to avoid damage to the PCB caused by the short circuit of the chip. However, this solution may increase design costs, and the fuse tube or the fuse chip may occupy a large area of the PCB.

Therefore, a new package structure is urgently needed to resolve the foregoing problem.

Terms used in the following embodiments are merely intended to describe specific embodiments, but are not intended to limit this application. As used in the specification and appended claims of the application, singular expressions "one", "a", "the foregoing", "the", and "the one" are intended to further include expressions such as "one or more", unless otherwise specified in the context clearly.

Reference to "an embodiment", "some embodiments", or the like described in this specification indicates that one or more embodiments of this application include a specific feature, structure, or characteristic described with reference to the embodiments. Therefore, statements such as "in an embodiment", "in some embodiments", "in some other embodiments", and "in other embodiments" that appear at different places in this specification do not necessarily mean reference to a same embodiment. Instead, the statements mean "one or more but not all of embodiments", unless otherwise specifically emphasized in another manner. The terms "include", "comprise", "have", and their variants all mean "include but are not limited to", unless otherwise specifically emphasized in another manner.

Figure 1:
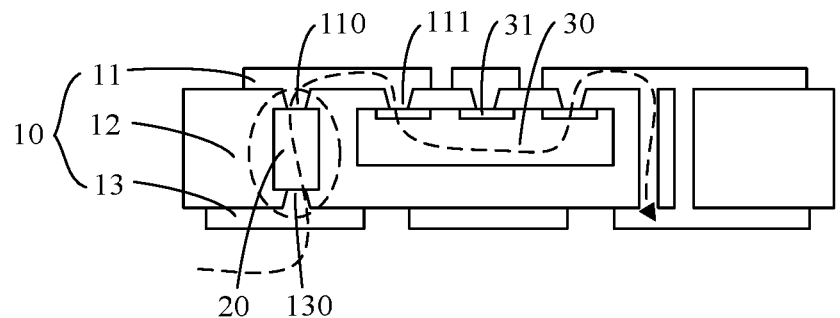
FIG. 1 is a schematic diagram of a package structure according to an embodiment of this application.

Refer to FIG. 1. This application provides a package structure. The package structure includes a protection structure 20, a circuit board 10, and a chip 30 packaged on the circuit board 10. The circuit board 10 may include a dielectric layer 12, a first cabling layer 11, and a second cabling layer 13. The first cabling layer 11 and the second cabling layer 13 are located on two opposite sides of the dielectric layer 12. In other words, the first cabling layer 11, the dielectric layer 12, and the second cabling layer 13 are laminated. The protection structure 20 is disposed inside the dielectric layer 12. The protection structure 20 connects the first cabling layer 11 to the second cabling layer 13. The chip 30 is electrically connected to the first cabling layer 11 or the second cabling layer 13, and a current flowing through the protection structure 20 flows through the first cabling layer 11 or the second cabling layer 13 to the chip 30. Specifically, in a process of powering on the chip 30 packaged on the circuit board 10, a current needs to flow through the protection structure 20 to the chip 30 electrically connected to the first cabling layer 11 or the second cabling layer 13. If the chip 30 is short-circuited, currents at the protection structure 20, the first cabling layer 11 or the second cabling layer 13, and the chip 30 are increased. A temperature of a cable used to carry the current and a temperature of the protection structure 20 rise due to the increase in the currents. The protection structure 20 is made of a hot-melt material, and a melting point of the hot-melt material is lower than a melting point of the first cabling layer 11 or the second cabling layer 13 through which the current flows. Therefore, the temperature of the protection structure 20 reaches the melting point first, and the protection structure 20 blows first. This can prevent the temperature of the cable through which the current flows from continuing to rise, and therefore prevent the circuit board 10 from being carbonized or catching fire, thereby reducing a loss.

The protection structure 20 is disposed inside the dielectric layer 12. When the chip 30 is short-circuited, the protection structure 20 may blow, to protect the circuit board 10. Because the protection structure 20 is disposed inside the dielectric layer 12, there is no need to dispose a fuse tube or a fuse chip on an outside of the circuit board 10, and a layout area of the circuit board 10 can be increased. An increment in the area is actually space occupied by the fuse tube or the fuse chip. The increase in the layout area of the circuit board 10 facilitates disposing another component on the circuit board 10, so that a workload of layout design of the circuit board 10 can be reduced and layout design efficiency of the circuit board 10 can be improved.

Specifically, the protection structure 20 may be disposed in a via of the dielectric layer 12. The protection structure 20 is used as a part of the via, and there is no need for an additional technological process, so that costs can be reduced. The via may extend along a thickness direction of the dielectric layer 12, and two ends of the protection structure 20 may be electrically connected to the first cabling layer 11 and the second cabling layer 13 respectively, to ensure that the current flowing through the chip 30 can flow through the protection structure 20 and reach the chip 30 connected to the first cabling layer 11 or the second cabling layer 13.

When the protection structure 20 is electrically connected to the first cabling layer 11 and the second cabling layer 13, an end that is of the protection structure 20 and that faces the first cabling layer 11 and an end that is of the protection structure 20 and that faces the second cabling layer 13 may be connected to the first cabling layer 11 and the second cabling layer 13 through laser drilling. Still refer to FIG. 1. Alternatively, a first connection terminal 110 is disposed on the first cabling layer 11, and a second connection terminal 130 is disposed on the second cabling layer 13. The first connection terminal 110 and the second connection terminal 130 may be disposed at two ends of the via. The first connection terminal 110 and the second connection terminal 130 are configured to connect to the two ends of the protection structure 20, so that the current for powering on the chip 30 can flow through the protection structure 20. Materials of the first connection terminal 110 and the second connection terminal 130 may be but are not limited to copper, aluminum, or stainless steel.

A material of the protection structure 20 in the foregoing embodiment may be a pure metal or an alloy. The material of the protection structure 20 may be but is not limited to one of zinc, cadmium, tin-antimony, tin-lead, lead-antimony, aluminum-magnesium, or aluminum-antimony. The melting point of the protection structure 20 may be 260° C. to 450° C. Specifically, the melting point of the protection structure 20 may be 270° C., 290° C., 350° C., or 420° C. When a short circuit occurs inside the chip 30, a current at the protection structure 20 is increased. The temperature of the protection structure 20 rises rapidly, so that the temperature of the protection structure 20 can quickly reach the melting point of the protection structure 20. As a result, the protection structure 20 blows, to protect the circuit board 10 and components disposed on the circuit board 10.

In the foregoing embodiment, in a process of powering on the chip 30, to ensure that the chip 30 can operate stably when the chip 30 is not short-circuited, a room-temperature resistivity of the protection structure 20 may be set to <120 nΩ*m. As a result, when the current flowing through the protection structure 20 is normal, a temperature generated by the protection structure 20 is low, so that the chip 30 can operate normally. It should be noted that the room-temperature resistivity of the protection structure 20 may be but is not limited to 110 nΩ*m, 90 nΩ*m, or 85 nΩ*m. This is not specifically limited herein.

In addition, the protection structure may specifically have a plurality of shapes, for example, a cylinder, a rectangular column, or a triangular column, as long as the protection structure 20 can be stably disposed in the via.

In the foregoing embodiment, when the chip is packaged on the circuit board 10, the chip 30 may be disposed at a plurality of different positions. For example, the chip 30 may be packaged inside the circuit board 10. Still refer to FIG. 1. Specifically, a direction of a dashed line in FIG. 1 is a direction of the current existing when the chip 30 is powered on. The chip 30 may be located on a side that is of the first cabling layer 11 and that faces the second cabling layer 13, and a plurality of third connection terminals 111 may be disposed on the side that is of the first cabling layer 11 and that faces the second cabling layer 13. The third connection terminal 111 may be electrically connected to a pin 31 on the chip 30. In this case, the first connection terminal 110 and the second connection terminal 130 respectively may be disposed at positions that are on the first cabling layer 11 and the second cabling layer 13 and that correspond to the via on the dielectric layer 12. The two ends of the protection structure 20 are connected to the first connection terminal 110 and the second connection terminal 130 respectively. The protection structure 20 may be used as a part of the via, so that the protection structure 20 does not additionally occupy space of the circuit board 10. When the chip 30 is powered on, the current may flow through the second cabling layer 13, the second connection terminal 130, the protection structure 20, the first connection terminal 110, and the first cabling layer 11 into the chip 30. When the chip 30 is short-circuited, currents at the second connection terminal 130, the protection structure 20, the first connection terminal 110, and the first cabling layer 11 that are parts of the foregoing current are increased. The temperature of the protection structure 20 rises due to the increase in the currents. After the temperature of the protection structure 20 rises to the melting point of the protection structure 20, the protection structure 20 blows. This can prevent temperatures of the second cabling layer 13 and the first cabling layer 11 through which the current flows from continuing to rise after the chip 30 is short-circuited, and therefore prevent the circuit board 10 from being carbonized or catching fire, thereby reducing a loss. Specifically, the chip 30 may be packaged at a position that is on the first cabling layer 11 and that is close to the via, so that the chip 30 can be closer to the protection structure 20 disposed in the via. As a result, when a short circuit occurs inside the chip 30, the protection structure 20 can quickly respond and protect the circuit board 10 in a timely manner. It should be noted that, that the chip 30 is packaged at the position that is on the first cabling layer 11 and that is close to the via may be understood as that the third connection terminal 111 disposed on the first cabling layer 11 is disposed at a position close to the via.

Figure 2:
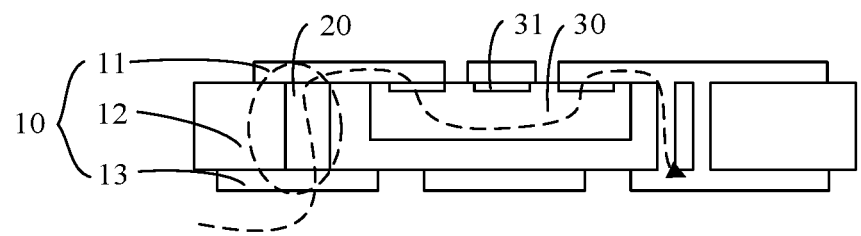
FIG. 2 is a schematic diagram of another package structure according to an embodiment of this application.

Refer to FIG. 2. A direction of a dashed line in FIG. 2 is a direction of a current existing when a chip 30 is powered on. When the chip 30 is packaged inside a circuit board 10, the chip 30 may be located on a side that is of a first cabling layer 11 and that faces a second cabling layer 13. A pin 31 on the chip 30 is directly connected to the side that is of the first cabling layer 11 and that faces the second cabling layer 13. Two ends of a protection structure 20 may be directly connected to the first cabling layer 11 and the second cabling layer 13. The protection structure 20 is located in a via, and the protection structure 20 may be used as a part of the via, so that the protection structure 20 does not additionally occupy space of the circuit board 10. When the chip 30 is powered on, the current flows through the second cabling layer 13, the protection structure 20, and the first cabling layer 11 into the chip 30. When the chip 30 is short-circuited, a current at the second cabling layer 13 and currents at the protection structure 20 and the first cabling layer 11 that are parts of the foregoing current are increased. A temperature of the protection structure 20 rises due to the increase in the currents. After the temperature of the protection structure 20 rises to a melting point of the protection structure 20, the protection structure 20 blows. This can prevent temperatures of the second cabling layer 13 and the first cabling layer 11 through which the current flows from continuing to rise, and therefore prevent the circuit board 10 from being carbonized or catching fire, thereby reducing a loss. Specifically, the chip may be packaged at a position that is on the first cabling layer 11 that is close to the via. As a result, when a short circuit occurs inside the chip 30, the protection structure 20 can quickly respond and protect the circuit board 10 in a timely manner.

It should be noted that, specifically, when the chip 30 is packaged inside the circuit board 10, the chip 30 may alternatively be electrically connected to the second cabling layer 13, which brings a same effect as the case in which the chip 30 is disposed on the first cabling layer 11. Details are not described herein again.

Figure 3:
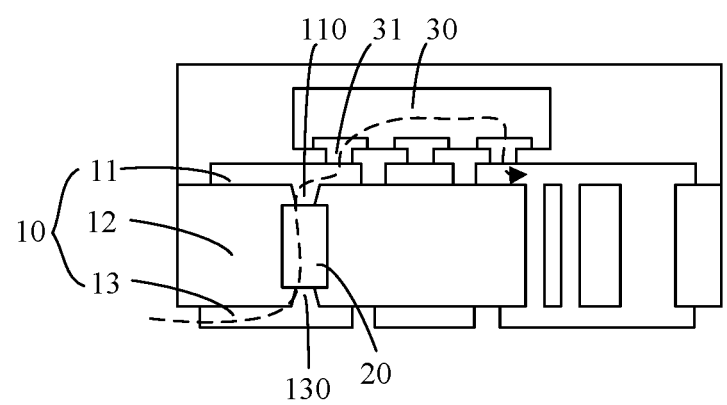
FIG. 3 is a schematic diagram of another package structure according to an embodiment of this application.

Refer to FIG. 3. A direction of a dashed line in FIG. 3 is a direction of a current existing when a chip 30 is powered on. The chip 30 may be packaged on an outside of the circuit board 10. Specifically, the chip 30 may be connected to a first cabling layer 11, or the chip 30 may be connected to a second cabling layer 13. An example in which the chip 30 is connected to the first cabling layer 11 is used. A pin 31 on the chip 30 may be located on a side facing the first cabling layer 11, and a first connection terminal 110 and a second connection terminal 130 respectively may be disposed at positions that are on the first cabling layer 11 and the second cabling layer 13 and that correspond to a via on a dielectric layer 12. Two ends of a protection structure 20 are connected to the first connection terminal 110 and the second connection terminal 130 respectively. The protection structure 20 may be used as a part of the via, so that the protection structure 20 does not additionally occupy space of the circuit board 10. When the chip 30 is powered on, a current may flow through the second cabling layer 13, the second connection terminal 130, the protection structure 20, the first connection terminal 110, and the first cabling layer 11 into the chip 30. When the chip 30 is short-circuited, a current at the second cabling layer 13 and currents at the protection structure 20 and the first cabling layer 11 that are parts of the foregoing current are increased. A temperature of the protection structure 20 rises due to the increase in the currents. After the temperature of the protection structure 20 rises to a melting point of the protection structure 20, the protection structure 20 blows. This can prevent temperatures of the second cabling layer 13 and the first cabling layer 11 through which the current flows from continuing to rise, and therefore prevent the circuit board 10 from being carbonized or catching fire, thereby reducing a loss.

Figure 4:
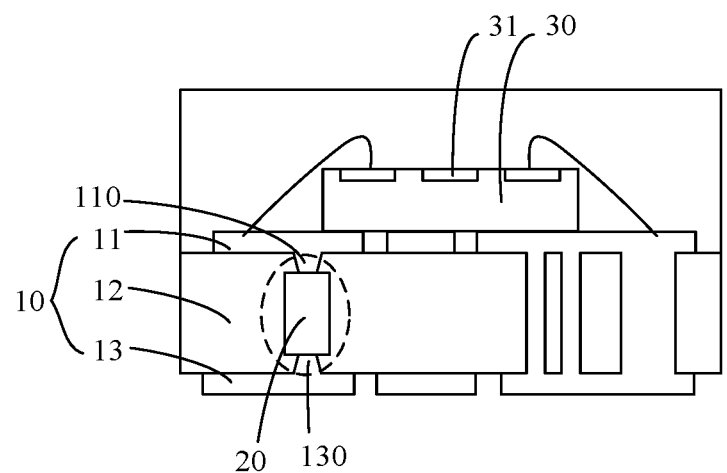
FIG. 4 is a schematic diagram of another package structure according to an embodiment of this application.

Refer to FIG. 4. A direction of a dashed line in FIG. 4 is a direction of a current existing when a chip 30 is powered on. The chip 30 may be packaged on an outside of the circuit board 10. In this case, a pin 31 on the chip 30 may face a side away from the first cabling layer 11. The pin 31 is electrically connected to the first cabling layer 11 through a lead. A first connection terminal 110 and a second connection terminal 130 respectively may be disposed at positions that are on the first cabling layer 11 and the second cabling layer 13 and that correspond to a via on a dielectric layer 12. Two ends of a protection structure 20 are connected to the first connection terminal 110 and the second connection terminal 130 respectively. The protection structure 20 may be used as a part of the via, so that the protection structure 20 does not additionally occupy space of the circuit board 10. When the chip 30 is powered on, a current may flow through the second cabling layer 13, the protection structure 20, the first cabling layer 11, and the lead into the chip 30. When the chip 30 is short-circuited, a current at the second cabling layer 13 and currents at the protection structure 20, the first cabling layer 11, and the lead that are parts of the foregoing current are increased. A temperature of the protection structure 20 rises due to the increase in the currents. After the temperature of the protection structure 20 rises to a melting point of the protection structure 20, the protection structure 20 blows. This can prevent temperatures of the second cabling layer 13 and the first cabling layer 11 through which the current flows from continuing to rise, and therefore prevent the circuit board 10 from being carbonized or catching fire, thereby reducing a loss.

When the chip 30 is disposed on the outside of the circuit board 10, the two ends of the protection structure 20 may alternatively be electrically connected to the first cabling layer 11 and the second cabling layer 13 without using the first connection terminal 110 and the second connection terminal 130. In other words, the two ends of the protection structure 20 may be electrically connected to the first cabling layer 11 and the second cabling layer 13 directly.

In the foregoing embodiment, the first cabling layer 11 may have a plurality of first cables, the second cabling layer 13 may have a plurality of second cables, and the plurality of first cables and the plurality of second cables may be disposed in a one-to-one correspondence. Specifically, when the chip 30 is packaged on the circuit board, there may be one chip 30 or a plurality of chips 30. Correspondingly, one or more vias may be disposed on the dielectric layer 12, at least one via may be disposed between each pair of the first cable and the second cable, and each pair of the first cable and the second cable may correspond to one chip 30.

According to a second aspect, this application further provides an electronic device, where the electronic device includes a housing and the package structure in any technical solution of the first aspect, and the package structure may be disposed in the housing. An effect generated by the electronic device having the package structure is the same as an effect of the package structure. Details are not described herein again. The electronic device may be a power chip, or a computer or a mobile phone having the power chip, or the like.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:
1. A package structure, comprising:
 a circuit board, comprising:
  a dielectric layer having a first dielectric layer side and a second dielectric layer side;
  a first cabling layer located on the first dielectric layer side and having a first melting point, and
  a second cabling layer located on the second dielectric layer side and having a second melting point;

a protection structure located inside the dielectric layer is and configured to electrically connect the first cabling layer to the second cabling layer, wherein the protection structure is made of a hot-melt material that has a third melting point; and a chip packaged on the circuit board and electrically connected to either the first cabling layer or the second cabling layer, wherein the chip is configured to receive a current from the protection structure and through either the first cabling layer or the second cabling layer to the chip; and wherein the third melting point is lower than the first melting point or the second melting point through which the current flows such that the protection structure is configured to blow when the chip is short-circuited.

2. The package structure according toof claim 1, wherein the dielectric layer comprises a via that extends along a thickness direction of the dielectric layer, and wherein the protection structure is disposed in the via.

3. The package structure of claim 2, wherein the first cabling layer comprises a first connection terminal, wherein the second cabling layer comprises a second connection terminal, wherein the first connection terminal and the second connection terminal correspond to the via, and wherein the first connection terminal and the second connection terminal respectively are electrically connected to two ends of the protection structure.

4. The package structure of claim 1, wherein the protection structure is made of a pure metal or an alloy, and wherein the third melting point is 260 degrees Celsius (° C.) to 450° C.

5. The package structure of claim 1, wherein a room-temperature resistivity of the protection structure is <120 nanoohm meters (nΩ*m).

6. The package structure of claim 1, wherein the chip packaged on the circuit board comprises the chip packaged inside the circuit board.

7. The package structure of claim 1, wherein the chip is further packaged on an outside of the circuit board, wherein the chip comprises a pin facing the circuit board and electrically connected to the first cabling layer or the second cabling layer.

8. The package structure of claim 1, wherein the chip is further packaged on an outside of the circuit board, and wherein the chip comprises:
a pin located on a side away from the circuit board; and
a lead electrically connecting the pin to the first cabling layer or the second cabling layer.

9. The package structure of claim 1, wherein the first cabling layer comprises a plurality of first cables, wherein the second cabling layer comprises a plurality of second cables, wherein the protection structure comprises tural of protection structures, wherein the plurality of first cables and the plurality of second cables are disposed in a one-to-one correspondence, and wherein at least one of the plurality of protection structures is disposed between each pair of the first cable and the second cable.

10. The package structure of claim 1, wherein the hot-melt material is at least one of zinc, cadmium, tin-antimony, tin-lead, lead-antimony, aluminum-magnesium, or aluminum-antimony.

11. An electronic device, comprising:
a housing; and
a package structure disposed inside the housing, wherein the package structure comprises:
the circuit board comprising:
a dielectric layer having a first dielectric layer side and a second dielectric layer side:
a first cabling layer located on the first dielectric layer side and having a first melting point, and
a second cabling layer located on the second dielectric layer side and having a second melting point;
a protection structure located inside the dielectric layer and configured to electrically connect the first cabling layer to the second cabling layer, wherein the protection structure is made of a hot-melt material that has a third melting point; and
a chip packaged on the circuit board and electrically connected to either the first cabling layer or the second cabling layer, wherein the chip is configured to receive a current from the protection structure and through either the first cabling layer or the second cabling layer to the chip; and
wherein the third melting point is lower than the first melting point or the second melting point through which the current flows such that the protection structure is configured to blow when the chip is short-circuited.

12. The electronic device of claim 11, wherein the dielectric layer comprises a via that extends along a thickness direction of the dielectric layer, and wherein the protection structure is disposed in the via.

13. The package-struct according toelectronic device of claim 12, wherein the first cabling layer comprises a first connection terminal, wherein the second cabling layer comprises a second connection terminal, wherein the first connection terminal and the second connection terminal correspond to the via, and wherein the first connection terminal and the second connection terminal respectively are electrically connected to two ends of the protection structure.

14. The electronic device of claim 11, wherein the protection structure is made of a pure metal or an alloy, and wherein the third melting point is 260 degrees Celsius (° C.) to 450° C.

15. The electronic device of claim 11, wherein a room-temperature resistivity of the protection structure is <120 nanoohm meters (nΩ*m).

16. The electronic device of claim 11, wherein the chip packaged on the circuit board comprises the chip packaged inside the circuit board.

17. The electronic device of claim 11, wherein the chip is further packaged on an outside of the circuit board, wherein the chip comprises a pin facing the circuit board and electrically connected to the first cabling layer or the second cabling layer.

18. The electronic device of claim 11, wherein the chip is further packaged on an outside of the circuit board, and wherein the chip comprises:
a pin located on a side away from the circuit board; and
a lead electrically connecting the pin to the first cabling layer or the second cabling layer.

19. The electronic device of claim 11, wherein the first cabling layer comprises a plurality of first cables, wherein the second cabling layer comprises a plurality of second cables, wherein the protection structure comprises a plurality of protection structures, wherein the plurality of first cables and the plurality of second cables are disposed in a one-to-one correspondence, and wherein at least one of the plurality of protection structures is disposed between each pair of the first cable and the second cable.

20. The electronic device of claim 11, wherein the hot-melt material is at least one of zinc, cadmium, tin-antimony, tin-lead, lead-antimony, aluminum-magnesium, or aluminum-antimony.

* * * * *